United States Patent [19]
McLaury

[11] Patent Number: 5,506,811
[45] Date of Patent: *Apr. 9, 1996

[54] DYNAMIC MEMORY WITH ISOLATED DIGIT LINES

[75] Inventor: Loren L. McLaury, Boise, Id.

[73] Assignee: Micron Technology Inc., Boise, Id.

[*] Notice: The term of this patent shall not extend beyond the expiration date of Pat. No. 5,369,622.

[21] Appl. No.: 246,443

[22] Filed: May 20, 1994

Related U.S. Application Data

[63] Continuation of Ser. No. 49,275, Apr. 20, 1994, Pat. No. 5,369,622.

[51] Int. Cl.⁶ .................................................. G11C 8/00
[52] U.S. Cl. ........................... 365/233; 365/203; 365/207; 365/149; 365/190
[58] Field of Search .................................. 365/233, 203, 365/189.01, 207, 230.01, 189.06, 149, 190

[56] References Cited

U.S. PATENT DOCUMENTS

| | | | |
|---|---|---|---|
| 4,636,987 | 1/1987 | Norwood et al. | 365/206 |
| 4,748,349 | 5/1988 | McAlexander, III et al. | 307/530 |
| 4,916,667 | 4/1990 | Miyabayashi et al. | 365/207 |
| 5,014,245 | 5/1991 | Muroka et al. | 365/194 |
| 5,029,137 | 7/1991 | Hoshi | 365/208 |
| 5,053,997 | 10/1991 | Miyamato et al. | 365/189.06 |
| 5,193,075 | 3/1993 | Hatano et al. | 365/154 X |
| 5,227,697 | 7/1993 | Sakagami | 365/203 |
| 5,235,547 | 8/1993 | Kobayashi | 365/190 |
| 5,291,432 | 3/1994 | Furutani | 365/149 X |

*Primary Examiner*—David C. Nelms
*Assistant Examiner*—Huan Hoang

[57] ABSTRACT

A memory in which a portion of a digit line is isolated from the remainder of the digit line during a write cycle has improved performance. In the conventional architecture of a memory device, cells are arranged in rows and columns and a sense amplifier is employed for a pair of columns, located between a pair of complementary digit lines. An embodiment of the present invention in this architecture provides improved means for isolating the sense amplifier during a write cycle.

31 Claims, 6 Drawing Sheets

DYNAMIC MEMORY WITH ISOLATED DIGIT LINES

CROSS REFERENCE TO RELATED APPLICATION

This is a continuation application of application Ser. No. 08/049,275, filed Apr. 20, 1994 now U.S. Pat. No. 5,369,622.

FIELD OF THE INVENTION

The invention relates to integrated circuit memories and particularly to such memories organized in rows and columns.

BACKGROUND OF THE INVENTION

Integrated circuit memories generally contain a two dimensional array of storage cells arranged in rows and columns. A common architecture connects all cells in a row to a common row line, often referred to as the "word line" and all cells in a column to a common column line often called the "digit line".

Cells in the array are identified by a binary row address and a binary column address. A row decoder responds to the binary row address and activates one row line for read or write access. A column decoder responds to the binary column address and activates read or write circuitry associated with one column, conventionally, a sense amplifier connected across a pair of complementary digit lines.

Integrated circuit memories are also generally binary logic circuits in which information is stored and transferred as logic states (conventionally, voltages) representing complementary logic values that are alternately referred to as "on" and "off", "true" and "false", "logic 1" and "logic 0", or logic "high" and logic "low". A voltage of 5 volts may represent the logic 1 state while a voltage of zero volts may represent the logic 0 state. Because of the constraints of resistance, capacitance, etc., the individual cells are usually at an intermediate voltage. Thus, subcircuits are associated with the digit lines of integrated circuit memories to pull the intermediate logic 1 voltage up to, or in excess of the full logic 1 voltage, for example, 5 volts. Other subcircuits pull the intermediate logic 0 down to, or below the logic 0 voltage, for example 0 volts. A common architecture employs a P-sense amplifier for the pull up subcircuit and an N-sense amplifier as the pull down subcircuit.

The present invention is particularly applicable to a conventional architecture used in dynamic random access memories (DRAM) and video random access memories (VRAM). In the conventional architecture each memory cell comprises a transistor and a capacitor connected in series. One side of the capacitor is connected to a reference voltage, and the other side is connected to the digit line through the transistor. The gate of the transistor is connected to the row line. Information is stored in the form of charge on the capacitor, which charge is input and output via the digit line and gated by the row line acting on the transistor gate. Often a large number of such cells are connected to each digit line. The digit lines are organized in pairs with an N-sense amplifier and a P-sense amplifier associated with each pair. The N-sense amplifier and the P-sense amplifier are each connected across a pair.

A sense amplifier is a bistable circuit having two complementary signal nodes (sense nodes) used for both input and output. In a read access, an addressed cell is gated onto the first digit line and no cells are gated onto the second digit line. The sense amplifier will then attain the bistable state corresponding to the charge of the addressed cell. The first and second digit lines will be driven by the sense amplifier to complementary states. In a write access a data signal, and its complement are gated onto a pair of digit lines with sufficient energy to overcome the sense amplifier's response to the addressed cell. The sense amplifier, after attaining the state corresponding to the data signal, will cause the addressed cell to be appropriately charged. When the read or write cycle is over, the pairs are shorted together (equilibrated), which quickly brings them to a mid-voltage level, resetting them for the next cycle.

A common arrangement of the various parts of the circuit described above locates the column decoder and DRAM input/output terminals at one end of the digit lines and the N-sense amplifiers at the center of the digit lines, thereby dividing each of the digit lines into two halves. One half of a digit line extends from the N-sense amplifier to the column decoder. The other half extends from the N-sense amplifier to the P-sense amplifier. In a conventional VRAM architecture the second half continues beyond the P-sense amplifier and connects to a sequential-access memory (SAM) port.

As is well known to those skilled in the art, references to N-sense and P-sense amplifiers within the same device are indicative of conventional CMOS devices.

As is well-known, integrated circuit memories are generally mass produced by fabricating hundreds of identical circuit patterns on a single semiconducting wafer. Each wafer is subsequently cut into hundreds of identical dies or chips. The advantages of building integrated circuits with smaller individual circuit elements are well known: more and more circuitry may be fabricated on a single chip, electronic equipment may become less bulky, reliability is improved by reducing the number of solder or plug connections, assembly and packaging costs are minimized, circuit performance may improve and higher clock speeds become feasible. For integrated circuit memories there are some disadvantages. As the size of the individual cell is reduced, the size of the individual electrical components in the cell and the strength of the electrical signals associated with them is also reduced. As the number of individual storage cells on a single chip is increased, the length of the digit lines connecting cells to sense amplifiers becomes longer. The capacitance associated with each digit line becomes large in comparison to the capacitance of a memory cell. Hence, the signal transferred to the digit line from an individual storage cell becomes weaker and the time for developing a useful signal level on a digit line will increase. As is well known, speed is an important factor in such memories. The faster the cells can be written, the faster the associated computer circuit of which the memory may be a part can operate, and the more functions the computer can adequately perform.

A number of enhancements have been made to DRAM and VRAM architecture to increase the signal level and sense amplifier response time. Several such enhancements are described in U.S. Pat. Nos. 4,748,349, 4,636,987, and 5,265,050. The first patent describes a circuit which boosts the voltage on the row line and, thus, the gate of the gating transistors to a value above the high logic voltage of the circuit. Boosting permits the full high logic voltage to be placed on the cell capacitor, since the threshold voltage drop across the gating transistor is eliminated. The second patent describes an architecture in which an N-sense amplifier is connected to a pair of digit lines at the mid point. Each half digit line connects to the N-sense amplifier through an isolation transistor. The isolation transistors respond to a timing signal to isolate the N-sense amplifier from one half of the digit line pair during a read cycle. For example, when the row being addressed is on the left half of the digit line pair, the isolating transistors between the N-sense amplifier and the left half of the digit line pair are on while the isolating transistors between the N-sense amplifier and the right half are off. Thus, the N-sense amplifier is connected to only one half of the full digit line during the read cycle. During a write cycle the P-sense amplifier is turned off and input data signals are driven from the I/O lines onto the full length of the digit lines. The third patent describes an isolation technique for faster read cycles. The method of writing data to a cell includes turning off the P-sense amplifier and driving input data from the I/O lines onto the full length of the digit lines.

There remains a need for a memory architecture that allows fast write cycles. A solution which also decreases power dissipation would be desirable. For many applications of integrated circuit memories, such as for portable computers and other battery powered intelligent devices, the amount of power available is limited. It is important in such applications that sense amplifiers not only are fast and small, but also consume a minimum of power. In the conventional technologies, the largest component of the total power used in a DRAM is used to charge and discharge digit lines.

SUMMARY OF THE INVENTION

The present invention solves the problems described above by providing improved means for isolating the N-sense amplifier during a write cycle. The invention is described in a first embodiment as a system for storing a data signal. The system includes a timing signal generator, first and second coupling circuits, a sense amplifier, and a cell for storing the logic state of the data signal. During a data storage operation, the system is responsive to the data signal and a control signal. The timing signal generator is responsive to the control signal for providing four timing signals. The first coupling circuit connects the data signal to the sense amplifier from a time after the first timing signal is received and until the second timing signal is received. The second coupling circuit connects the sense amplifier to the cell from a time after the third timing signal is received and until the fourth timing signal is received. In operation, the sense amplifier attains a state corresponding to the data signal until the second timing signal is received and the cell attains a state corresponding to the data signal until the fourth timing signal is received.

In a second embodiment, the system for storing a data signal additionally includes an improved timing signal generator. The timing signal generator includes a pulse generator and a delay circuit. The pulse generator is coupled to the control signal and provides the first timing signal. The delay circuit is coupled to the first timing signal and provides the second timing signal.

In another embodiment, the control signal includes two conventional signals: a column address strobe and a write enable signal.

The present invention is practiced according to a first method for storing a data signal in a memory device. The memory device includes a sense amplifier, first and second coupling circuits, and a cell for storing the data signal. The method comprises the steps of decoupling the cell from the sense amplifier; coupling the data signal to the sense amplifier for a time sufficient for the sense amplifier to attain a state corresponding to the data signal; decoupling the data signal from the sense amplifier; and coupling the sense amplifier to the cell for a time sufficient for the cell to attain a state corresponding to the data signal.

In another embodiment of the method described above, the step of coupling the data signal to the sense amplifier further comprises charging a distributed capacitance; and the step of decoupling the data signal from the sense amplifier further comprises decoupling at a position in the circuit so that a portion of the distributed capacitance remains coupled to the N-sense amplifier.

By decoupling the cell from the sense amplifier, a sense amplifier of the present invention can more quickly attain a state corresponding to the data signal during a write operation.

By allowing a portion of the distributed capacitance to remain coupled to the sense amplifier when the cell is coupled to the sense amplifier, the cell of the present invention can more quickly attain a state corresponding to the state of the sense amplifier, and hence, the data signal.

According to a first aspect of the present invention, a sense amplifier is located between a data signal and a storage cell so that the time required for the data signal to charge the cell is reduced.

According to another aspect, the data signal is amplified by the sense amplifier so that a reduced amount of power is required from the source of the data signal during a write operation.

According to another aspect of the present invention as applied to conventional memory array architectures, the coupling circuits of the present invention operate to isolate a portion of the digit line in less time than is required to disable the conventional P-sense amplifier. When coupled to less than the full extent of a digit line, an N-sense amplifier of the present invention has sufficient drive to overcome the P-sense amplifier without turning off the P-sense amplifier during a write operation.

According to yet another aspect, the simplicity of the coupling circuits of the present invention permit implementation of the present invention in a single bit transfer architecture. Improved writing speed can be obtained without the design limitations of flash write and other multi-bit write architectures.

According to still another aspect of the present invention as applied to conventional memory array architectures, the first coupling circuit may include the functions of the conventional column decoder. Operation of the first coupling circuit to decouple the data signal from the sense amplifier permits initialization of the column decoder for subsequent operations at a time earlier than is conventionally permitted.

These and other aspects, advantages, functions and results of the present invention will become apparent to those skilled in the art by reference to the following description of the invention in conjunction with the accompanying drawing figures.

BRIEF DESCRIPTION OF THE DRAWINGS

In the functional block diagrams, a broad arrow symbolically represents a group of signals that together signify a binary code. A group of address lines is represented by a broad arrow because a binary address is signified by the signals taken together at an instant in time. A group of signals having no binary coded relationship is shown as a single line with an arrow. A single line between functional blocks represents one or more control signals. Signals that appear on several of the figures and have the same mnemonic are directly or indirectly coupled together. A signal named with a mnemonic and a second signal named with the same mnemonic followed by an asterisk are related by logic inversion.

In each timing diagram the vertical axis represents binary logic levels and the horizontal axis represents time. Neither axis is drawn to scale. The vertical axis is intended to show the transition from active (asserted) to passive (non-asserted) states of each logic signal. The voltage levels corresponding to the logic states of the various signals are not necessarily identical among the various signals.

DETAILED DESCRIPTION OF THE INVENTION

Figure 1:
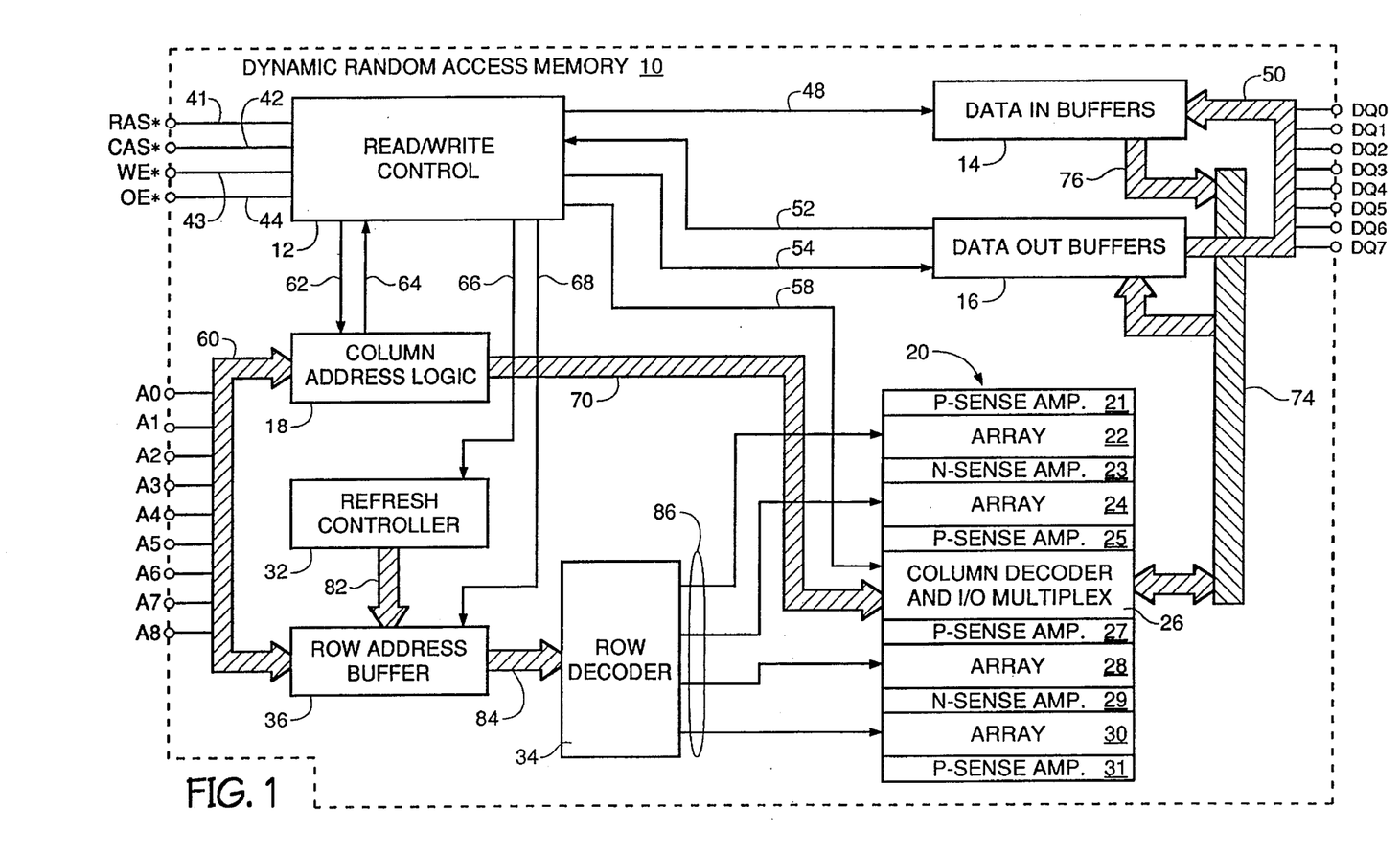
FIG. 1 is a functional block diagram of a dynamic random access memory device of the present invention.

FIG. 1 is a functional block diagram of a dynamic random access memory device 10 of the present invention. Memory device 10 is controlled by binary control signals 41–44 input from the device pads to read/write control 12. Control signals 41–44 are conventionally known by names corresponding to the primary function of each signal. Signal 41 is row address strobe (RAS*). Signal 42 is column address strobe (CAS*). Signal 43 is write enable (WE*). Signal 44 is output enable (OE*). When RAS* falls, the state of address bus 60 is latched in row address buffer 36 in response to control signals 68. When CAS* falls, the state of address bus 60 is latched in column address logic 18 in response to control signals 62. Read/Write control 12 also responds to changes in the column address as indicated by address change signals 64 for improved read access time as in page mode.

Several read and write modes of operation are conducted by read/write control 12 in response to combinations of control signals 41–44 and address change signals 64. Refresh mode is one such operation conducted when RAS* is pulsed while CAS, is low. During refresh mode, refresh controller 32 generates refresh row address bus 82 in response to control signals 66. Row address buffer 36 provides row address bus 84 to row decoder 34. Binary row address bus 84, in response to control signals 68, represents either the address latched when RAS* falls or the refresh row address, depending on the mode of operation.

A single memory cell of memory array 20 is selected for read and write operations according to the intersection of a decoded row signal and a decoded column signal. Binary row address bus 84 is coupled to row decoder 34. Row decoder 34 asserts a row select signal on one or more row activating signals 86. Column address logic 18 presents binary column address bus 70 to column decoder 26. Column decoder 26 asserts a signal to be discussed on FIG. 2 to be used by column decoder 26 for selecting one or more columns, selecting a pair of I/O lines, and coupling these lines to global I/O signals 74. If row decoder 34 and column decoder 26 provide signals that activate more than one memory cell from memory array 28, further selection is accomplished by decoding circuitry in column decoder 26. Memory array 20 is organized in a multiple of 4 arrays 22, 24, 28, and 30. P-sense amplifiers 21, 25, 27, and 31 are located along digit line pairs (not shown). N-sense amplifiers 23 and 29 are located along the digit line pair, optimally, at or near the midpoint of the distributed capacitance of one of the digit lines.

Sense amplifiers (both P-sense amplifiers and N-sense amplifiers) perform several functions responsive to control signals 58 shown generally coupled to memory array 20. In refresh mode of operation, the content of a memory cell is refreshed by sense amplifiers. When cell contents are to be overwritten in a write operation, sense amplifiers establish proper cell contents in response to write data signals 76 from data in buffers 14. In read operations cell contents are amplified and presented to data out buffers 16 on global I/O signals 74.

Data in buffers 14 are instrumental for write operations. Data in buffers 14 are driven by data bus 50 which comprises several individual data lines shown as DQn. Alternate memory devices may have less or more DQ lines and may have separate lines for the data in (D) function and the data out (Q) function. As show, memory device 10 has eight DQ lines, each of which is bidirectional. Each bidirectional line is driven by a three state circuit to represent a logic low, a logic high, or an off state. In the off state, the three state circuit connects a high impedance to the DQ line so that drive circuits external to memory device 10 can drive a signal onto the DQ line for data in buffer 14

Improved write operation is made possible in the present invention by the cooperation of data in buffers 14, read/write control 12, and circuits shown generally on FIG. 1 as sense amplifiers and column decoder 26. In response to current and anticipated modes of operation indicated by control signals 41–44, read/write control 12 provides control signals 48 to data in buffers 14. We now turn to describe a portion of memory array 20.

Figure 2:
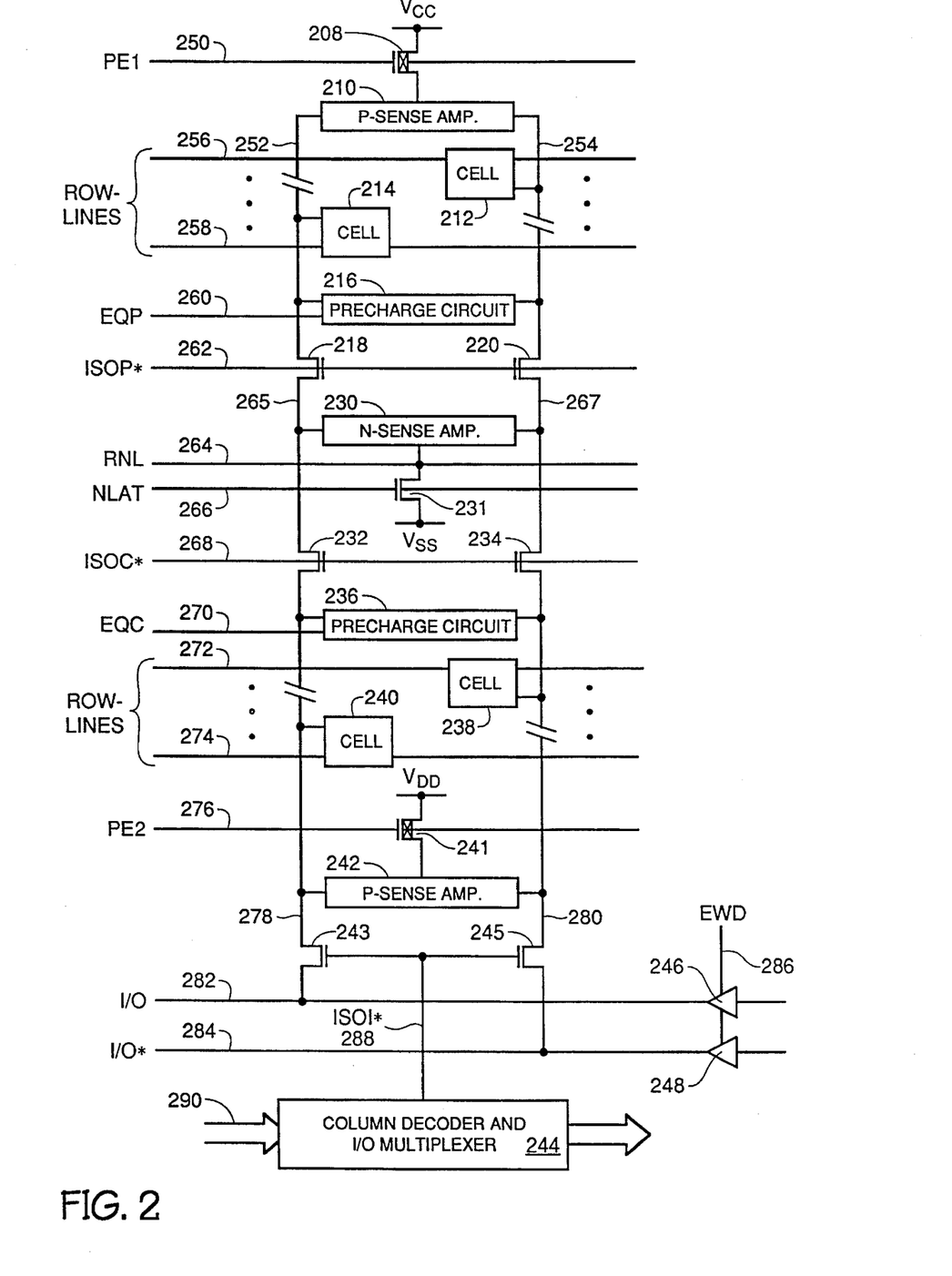
FIG. 2 is a functional block diagram of a portion of the memory array and sense amplifiers of the memory device shown in FIG. 1.

FIG. 2 is a schematic diagram of a portion of memory array 20 shown in FIG. 1. FIG. 2 depicts circuitry associated with 4 digit lines making up two column lines. Each column line is divided into two digit lines by isolation devices to be discussed. For example, a first digit line 252 extends from P-sense amplifier 210 down to a first isolation device 218. Digit line 278 extends from isolation device 232 to P-sense amplifier 242. Isolation device 243 then connects the column line (comprising digit lines 252 and 278) to an I/O line 282. In a similar manner, the complementary column line is divided into sections by isolation devices 220, 234, and 245. It is conventional, though somewhat confusing, to describe digit lines 252,278,254 and 280 as a column, though it is more properly a pair of column lines.

P-sense amplifier 210 acts as an active pull up subcircuit. It is enabled by PE1 signal 250 through device 208. In operation, P-sense amplifier 210 provides a pull up voltage to one of the two digit lines 252 and 254.

There are 4 memory cells shown in FIG. 2: cell 212, 214, 238, and 240. Each cell is enabled by one of row lines 256, 258, 272, and 274, respectively. Only one row line is active at a time, thereby, connecting only one cell to a digit line. When row line 256 is active, cell 212 is connected to digit line 254 and digit line 252 would not have a cell connected to it.

Precharge circuit 216 is enabled by EQP signal 260. The precharge circuit establishes equilibration voltages and set up conditions on digit lines 252 and 254. Isolation devices 218 and 220 are enabled by ISOP* signal 262. When active, ISOP* decouples digit lines 252 and 254 from N-sense amplifier 230.

N-sense amplifier 230 provides an active pull down subcircuit. it is enabled through device 231 by RNL signal 264 and NLAT signal 266. Isolation devices 232 and 234 are enabled by ISOC* signal 268. When active, ISOC* decouples digit lines 278 and 280 from N-sense amplifier 230.

Precharge circuit 236 is enabled by EQC signal 270. Precharge circuit 236 operates similarly to precharged circuit 216. P-sense amplifier 242 functions similarly to P-sense amplifier 210. P-sense amplifier 242 is enabled by PE2 signal 276 through device 241. Digit lines 278 and 280 are coupled to I/O line 282 and 284 respectively through isolation devices 243 and 245. Isolation devices 243 and 245 are enabled by ISOI* signal 288. Column decoder 244 provides ISOI* 288 in response to a portion of column address bus 70 (shown in FIG. 1) depicted in FIG. 2 as column address signals 290.

Drivers 246 and 248 are enabled by signal EWD signal 286. During a write operation, data signals present at the inputs of drivers 246 and 248 are driven onto I/O lines 282 and 284. The operation of the circuitry shown on FIG. 2 is best understood by referring to FIG. 3.

Figure 3:
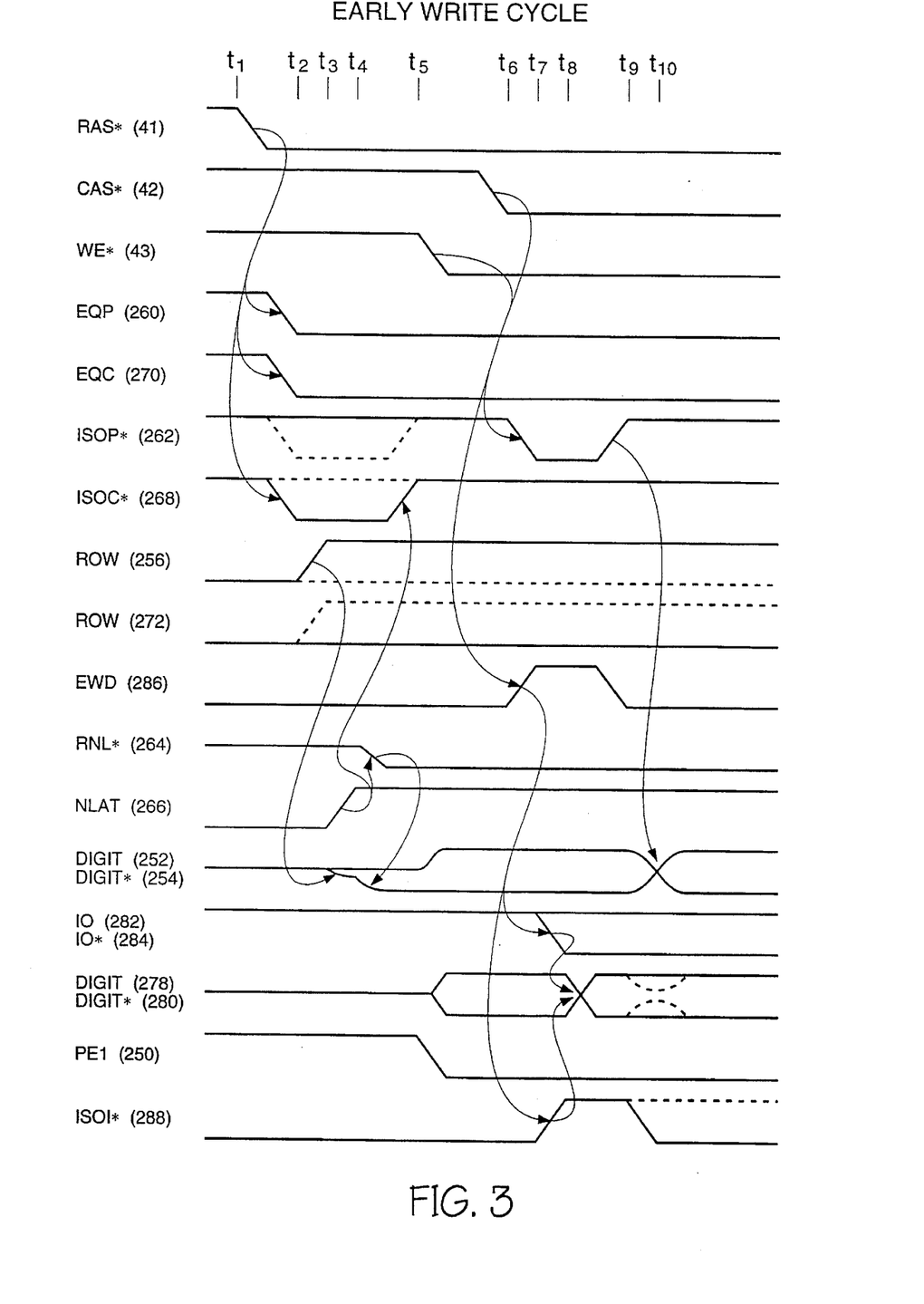
FIG. 3 is a timing diagram describing an early write method of controlling sense amplifiers and input buffer circuits shown in FIGS. 1 and 2. The vertical axis represents binary logic levels and the horizontal time axis is not to scale.

FIG. 3 is a timing diagram of an early write cycle using the circuity shown in FIG. 2. A write operation to cell 212 is shown in solid lines and a write operation to cell 238 is shown in dotted lines. From time T1 to time T5, N-sense amplifier 230 attains a state corresponding to data in the addressed cell. For example, if cell 212 is addressed, digit lines 252 and 254 are coupled to N-sense amplifier 230 by operation of signal ISOP*. Digit lines 278 and 280 are isolated from N-sense amplifier 230 by operation of signal ISOC*. Finally, N-sense 230 is activated by signals RNL* and NLAT at times T3 and T4. At time T5, digit lines 252 and 254 are beginning to separate corresponding to data in the addressed cell. From time T1 to time T5, digit lines 278 and 280 have been isolated from I/O lines 282 and 284. Only the digit lines extending toward the addressed cell have been connected to N-sense amplifier 230.

At time T6 CAS* falls while WE* is low, indicating the beginning of an early write cycle. In response to CAS* falling, drivers 246 and 248 are enabled and coupled to N-sense amplifier 230. Signal ISOP* is taken low, turning off devices 218 and 220, so that the distributed capacitance of digit lines 252 and 254 does not appear as a load to drivers 246 and 248.

At time T9, a predetermined delay from time T6, signal ISOP* is raised. N-sense amplifier 230 then writes cell 212 while loaded only by the distributed capacitance of line 252 and 254. The capacitance of lines 278 and 280 can provide additional drive capability. When I/O lines 282 and 284 and drivers 246 and 248 are no longer needed, signals ISOI* and EWD are dropped. The pulse widths of signals ISOI* and EWD result from predetermined delays measured from the rising edge of each signal, respectively. Because the charge from digit lines 278 and 280 can be used to provide additional drive capability, the voltage on these lines may droop as shown at time T10. Although signal ISOI* is shown falling at time T9, the pulse width of ISOI* could be lengthened as shown by the dotted line extending from time T9 through time T10.

Figure 4A:
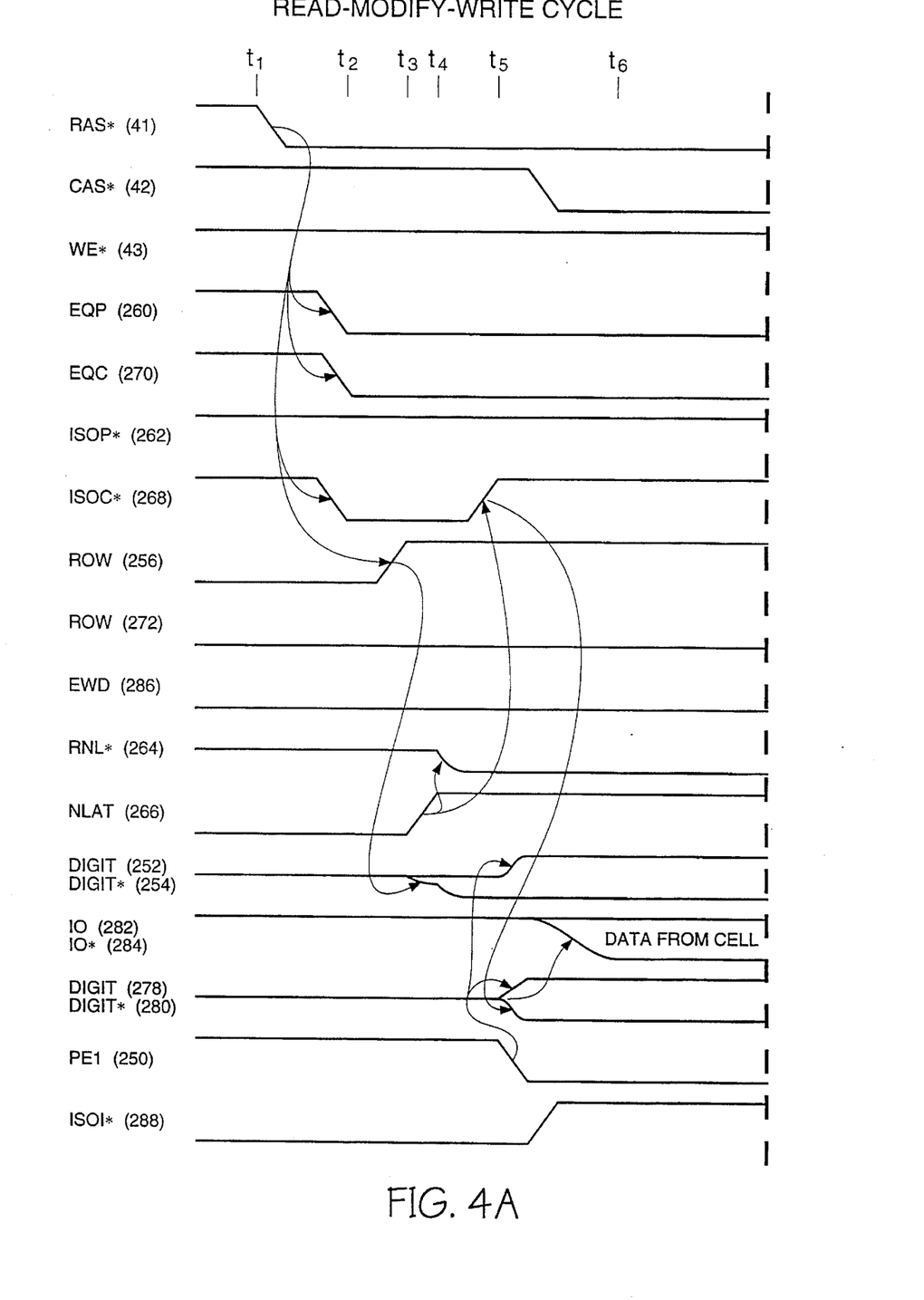
FIG. 4a and FIG. 4b present a timing diagram describing a read-write method of controlling sense amplifiers and input buffer circuits shown in FIGS. 1 and 2. The vertical axis represents binary logic levels and the horizontal time axis is not to scale.
Figure 4B:
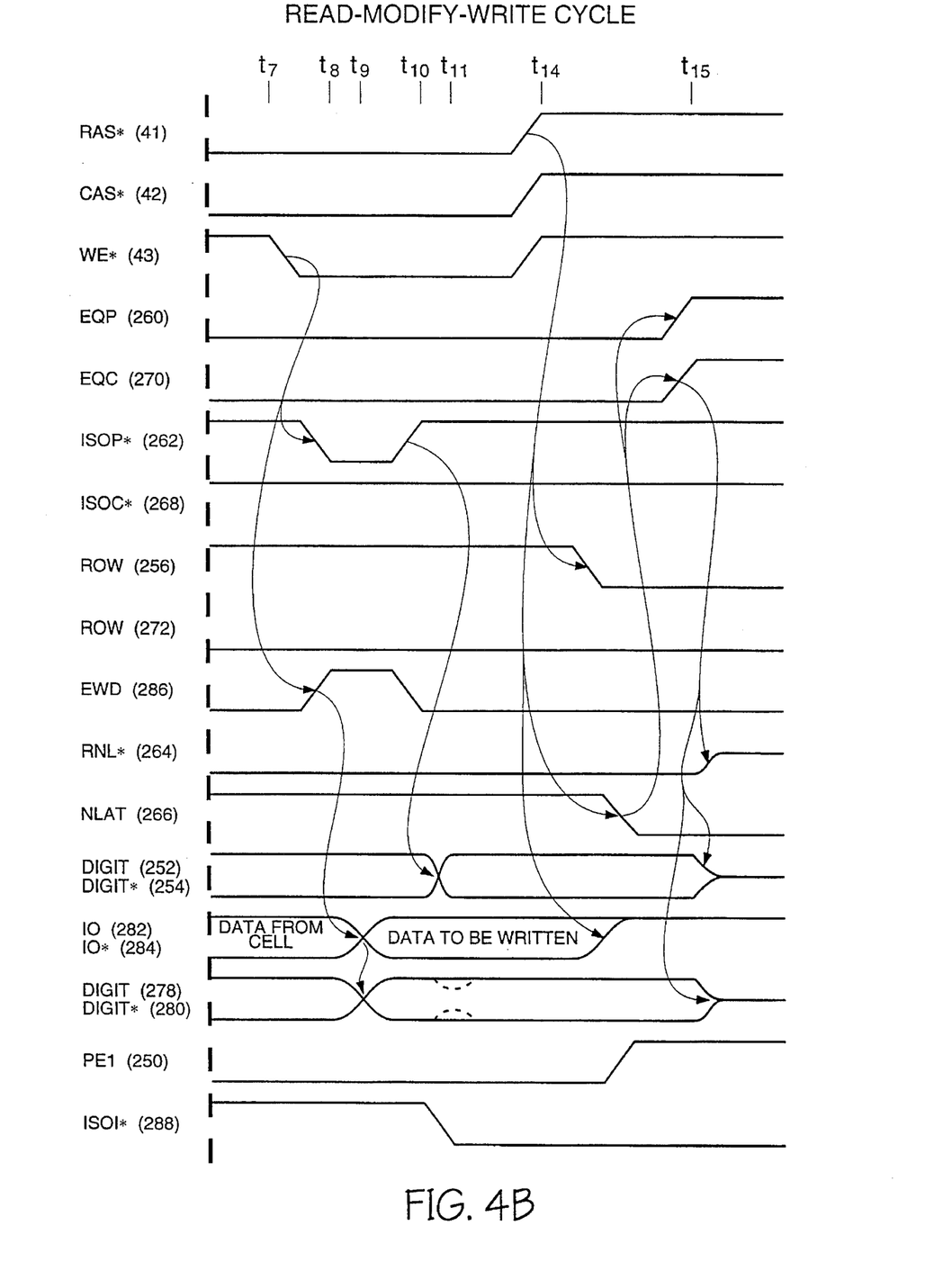

FIGS. 4a and 4b present a timing diagram of a read-modify-write cycle using the circuity shown in FIG. 2, particularly cell 212. From time T1 to time T5, N-sense amplifier 230 attains a state corresponding to data in cell 212 in a manner as already described for FIG. 3. Data from the cell appears on I/O lines 282 and 284 at time T6.

At time T7 WE* falls while CAS* is low, indicating the beginning of the write portion of the read-modify-write cycle. Events from time T8 to time T11 correspond to those events already described in FIG. 3 from time T7 to time T10. Specifically, driver 246 and 248 are enabled and coupled to N-sense amplifier 230. After N-sense amplifier 230 attains a state corresponding to input data from drivers 246 and 248, ISOP* signal 262 returns high, allowing N-sense amplifier 230 to write cell 212. While ISOC* signal 268 is low, N-sense amplifier 230 is loaded only by the distributed capacitance of line 252.

Figure 5:
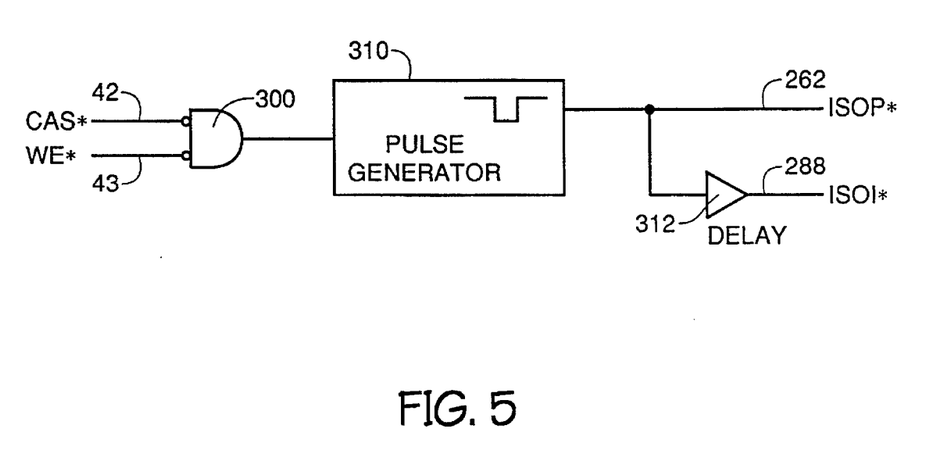
FIG. 5 is a schematic diagram of a portion of read write control 12 shown in FIG. 1.

FIG. 5 is a schematic diagram of a portion of read write control 12 shown on FIG. 1. Pulse generator 310 is triggered by CAS* signal 42 and WE* signal 43 to provide a low going pulse on ISOP* signal 262. ISOI, signal 288 is derived from signal ISOP* after a delay imposed by circuit 312.

The foregoing description discusses preferred embodiments of the present invention, which may be changed or modified without departing from the scope of the present invention. Those skilled in the art will understand that the logical elements described above may be formed using a wide variety of logical gates employing any polarity of input or output signals and that the logical values described above may be implemented using different voltage polarities. These and other changes and modifications are intended to be included within the scope of the present invention.

While for the sake of clarity and ease of description, several specific embodiments of the invention have been described, the scope of the invention is intended to be measured by the claims as set forth below. Other embodiments of the invention will be apparent in light of the disclosure to one of ordinary skill in the arts to which the invention applies. For example, P-channel FETS may be substituted for N-channel FETS (and vice versa) in some applications with appropriate polarity changes in controlling signals as required. Moreover, the P-channel and N-channel FETS discussed above generally represent active devices which may be replaced with bipolar or other technology active devices.

The words and phrases used throughout the specification and the claims are intended to be broadly construed. A "system" refers generally to electrical apparatus and includes, but is not limited to, a packaged integrated circuit, an unpackaged integrated circuit, a combination of packaged or unpackaged integrated circuits or both, a microprocessor, a microcontroller, a memory, a register, a flip-flop, a charge-coupled device, combinations thereof, and equivalents. A "signal" refers to mechanical and/or electromagnetic energy conveying information. When elements are coupled, a signal can be conveyed in any manner feasible in light of the nature of the coupling. For example, if several electrical conductors couple two elements, then the relevant signal comprises the energy on one, some, or all conductors at a given time or time period. When a physical property of a signal has a quantitative measure and the property is used by design to control or communicate information, then the signal is said to be characterized by having a "value." For a binary (digital) signal, the two characteristic values are called logic "states."

What is claimed is:

1. A memory responsive to a data signal, an address signal, and a write control signal, the memory comprising:
   a. a cell for storing data conveyed by the data signal;
   b. a cell selection circuit coupled to the address signal for providing a row signal and a column signal;
   c. a digit line;
   d. an access circuit for coupling the cell to the digit line in response to the row signal;
   e. a timing circuit responsive to the write control signal, for providing a first timing signal and a second timing signal;
   f. a sense amplifier comprising a sense node, the sense amplifier coupled to the cell selection circuit, the sense amplifier for establishing, on the sense node a signal conveying stored data;
   g. an isolator coupled to the timing circuit and responsive to the first timing signal, the isolator coupled between the digit line and the sense node for isolating the digit line from the sense node; and
   h. a buffer coupled to the digit line for driving the data signal onto the digit line;
   wherein the timing circuit is responsive to the write control signal for providing the first timing signal to isolate the cell from the sense node while the data signal is coupled to the sense node for a time at least sufficient for the sense amplifier to attain a state corresponding to the data signal, then for providing the second timing signal to isolate the buffer from the sense node while the sense amplifier is coupled to the cell for a time at least sufficient for the cell to attain a state corresponding to the sense amplifier.

2. The memory of claim 1 wherein the timing circuit further comprises:
   a. a pulse generator, the pulse generator coupled to the write control signal for providing the first timing signal; and
   b. a delay circuit coupled to the first timing signal for providing the second timing signal.

3. A dynamic memory responsive to a data signal, the memory comprising:
   a. a first conductor and a second conductor, the first conductor having a capacitance, the capacitance having a charge;
   b. a sense amplifier coupled to the first conductor;
   c. a first switch for coupling the data signal to the first conductor so that the charge and the sense amplifier are responsive to the data signal while the first switch is closed;
   d. a second switch in series between the first conductor and the second conductor;
   e. a dynamic memory cell coupled to the second conductor; and
   f. a timing circuit for operating the first switch and the second switch so that after the sense amplifier and the capacitance have responded to the data signal, the first switch is opened and the second switch is closed, thereby writing data to the cell.

4. The memory of claim 3 wherein the capacitance comprises a distributed capacitance.

5. The memory of claim 3 wherein the first conductor and the second conductor comprise a bit line.

6. The memory of claim 3 wherein the sense amplifier is an N-sense amplifier.

7. The memory of claim 3 wherein the second switch comprises a second FET, the second FET comprises a second control terminal and a second channel, the second channel being coupled in series between the first conductor and the second conductor.

8. The memory of claim 3 wherein:
   a. the memory is further responsive to a column address strobe and a write enable signal;
   b. the memory further comprises a column select circuit responsive to the column address strobe; and
   c. the timing circuit is responsive to the column address strobe and the write enable signal.

9. The memory of claim 3 wherein the first switch comprises a first FET, the first FET comprises a first control terminal and a first channel, the first channel being coupled to the first conductor for conducting the data signal.

10. The memory of claim 9 wherein the first control terminal is coupled to a column decoder.

11. The memory of claim 3 wherein:
    a. the first switch comprises a first FET, the first FET comprises a first control terminal and a first channel, the first channel being coupled to the first conductor for conducting the data signal;
    b. the second switch comprises a second FET, the second FET comprises a second control terminal and a second channel, the second channel being coupled in series between the first conductor and the second conductor; and
    c. the timing circuit provides a first timing signal coupled to the first control terminal and a second timing signal coupled to the second control terminal.

12. The memory of claim 11 wherein the timing circuit further comprises a delay element, responsive to the second timing signal, for providing the first timing signal after a delay.

13. The memory of claim 3 wherein:
    the memory is further responsive to a prebuffer data signal; and
    b. the memory further comprises a buffer for providing the data signal responsive to the prebuffer data signal.

14. The memory of claim 13 wherein:
    a. the memory is further responsive to a column address strobe and a write enable signal;
    b. the memory further comprises a column select circuit responsive to the column address strobe; and
    c. the buffer is enabled responsive to the column address strobe and the write enable signal.

15. The memory of claim 3 further comprising a second sense amplifier coupled to the second conductor.

16. The memory of claim 15 further comprising a third sense amplifier coupled to the first conductor.

17. A dynamic memory responsive to a data signal, the memory comprising:
    a. a first, a second, and a third conductor, the first conductor having a capacitance, the capacitance having a charge;
    b. a sense amplifier coupled to the second conductor;
    c. a first switch for coupling the data signal to the first conductor;
    d. a second switch in series between the first conductor and the second conductor, so that the charge and the sense amplifier are responsive to the data signal while the first switch and the second switch are closed;

e. a third switch in series between the second conductor and the third conductor;

f. a first dynamic memory cell coupled to the third conductor; and g. a timing circuit for operating the first, the second, and the third switch so that after the sense amplifier and the capacitance have responded to the data signal, the first switch is opened and the third switch is closed, thereby writing data to the first cell.

18. The memory of claim 17 wherein the capacitance comprises a distributed capacitance.

19. The memory of claim 17 wherein the first conductor and the second conductor comprise a bit line.

20. The memory of claim 17 wherein the sense amplifier is an N-sense amplifier.

21. The memory of claim 17 wherein:

a. the memory is further responsive to a column address strobe and a write enable signal;

b. the memory further comprises a column select circuit responsive to the column address strobe; and c. the timing circuit is responsive to the column address strobe and the write enable signal.

22. The memory of claim 17 wherein:

a. the first switch comprises a first FET, the first FET comprises a first control terminal and a first channel, the first channel being coupled to the first conductor for conducting the data signal;

b. the second switch comprises a second FET, the second FET comprises a second control terminal and a second channel, the second channel being coupled in series between the first conductor and the second conductor;

c. the third switch comprises a third FET, the third FET comprises a third control terminal and a third channel, the third channel being coupled in series between the second conductor and the third conductor; and d. the timing circuit provides a first timing signal coupled to the first control terminal, a second timing signal coupled to the second control terminal, and a third control signal coupled to the third control terminal.

23. The memory of claim 22 wherein the timing circuit further comprises a delay element, responsive to the second timing signal, for providing the first timing signal after a delay.

24. The memory of claim 17 wherein:

a. the memory is further responsive to a prebuffer data signal; and b. the memory further comprises a buffer for providing the data signal responsive to the prebuffer data signal.

25. The memory of claim 24 wherein:

a. the memory is further responsive to a column address strobe and a write enable signal;

b. the memory further comprises a column select circuit responsive to the column address strobe; and c. the buffer is enabled responsive to the column address strobe and the write enable signal.

26. The memory of claim 17 further comprising a second sense amplifier coupled to the third conductor.

27. The memory of claim 26 further comprising a third sense amplifier coupled to the first conductor.

28. The memoryof claim 17 wherein the first switch comprises a first FET, the first FET comprises a first control terminal and a first channel, the first channel being coupled to the first conductor for conducting the data signal.

29. The memory of claim 28 wherein the first control terminal is coupled to a column decoder.

30. The memory of claim 28 wherein the second switch comprises a second FET, the second FET comprises a second control terminal and a second channel, the second channel being coupled in series between the second conductor and the third conductor.

31. The memory of claim 30 wherein the third switch comprises a third FET, the third FET comprises a third control terminal and a third channel, the third channel being coupled in series between the second conductor and the third conductor.

* * * * *